(12) United States Patent
Maloney et al.

(10) Patent No.: US 6,437,553 B1
(45) Date of Patent: Aug. 20, 2002

(54) METHOD FOR DELAY LINE LINEARITY TESTING

(75) Inventors: Mark W. Maloney, Sunnyvale, CA (US); Eugene A. Roylance, Boise; Robert D. Morrison, Star, both of ID (US)

(73) Assignee: AgilentTechnologies, Inc., Palo Alto, CA (US)

( * ) Notice: Subject to any disclaimer, the term of this patent is extended or adjusted under 35 U.S.C. 154(b) by 105 days.

(21) Appl. No.: 09/675,918

(22) Filed: Sep. 29, 2000

(51) Int. Cl.[7] .............................................. G01R 25/00
(52) U.S. Cl. ................... 324/76.35; 324/617; 327/276; 331/57; 331/44
(58) Field of Search .......................... 324/76.35, 617, 324/76.16, 76.47, 76.79, 601, 616; 327/276, 292; 331/57, 44, 74, 46, 49

(56) References Cited

U.S. PATENT DOCUMENTS

| | | | | |
|---|---|---|---|---|
| 3,769,580 A | * | 10/1973 | Black | ......................... 324/616 |
| 4,604,588 A | * | 8/1986 | Webler et al. | ........... 324/76.79 |
| 4,703,251 A | * | 10/1987 | Baumgartner et al. | ...... 324/601 |
| 4,875,201 A | * | 10/1989 | Dalzell | ........................ 327/265 |
| 4,884,020 A | * | 11/1989 | Blakeslee | ................. 324/76.47 |
| 4,929,894 A | * | 5/1990 | Monett | ........................ 324/212 |

* cited by examiner

*Primary Examiner*—N. Le
*Assistant Examiner*—Vincent Q. Nguyen (57) ABSTRACT

The present invention provides both differential and integral non-linearity measurement capabilities with a minimum of additional hardware and a test time reduction of several orders of magnitude. The test circuit for N delay lines includes a ring oscillator that has a select signal and an output. A counter is connected in parallel with the ring oscillator. An arithmetic logic unit receives a "COMPARE" value from a register and the counter output. An upper and a lower bound register store acceptable tolerances for non-linearity. Each comparator, upper and lower bound, receives the tolerance stored in the corresponding register and the output of the arithmetic logic unit. An AND gate receives the outputs of the upper and lower bound comparators and generates a signal indicative of the state of the oscillator.

13 Claims, 7 Drawing Sheets

METHOD FOR DELAY LINE LINEARITY TESTING

FIELD OF THE INVENTION

The invention relates to the field of automatic test generation, particularly towards delay line testing.

BACKGROUND

Figure 1A:
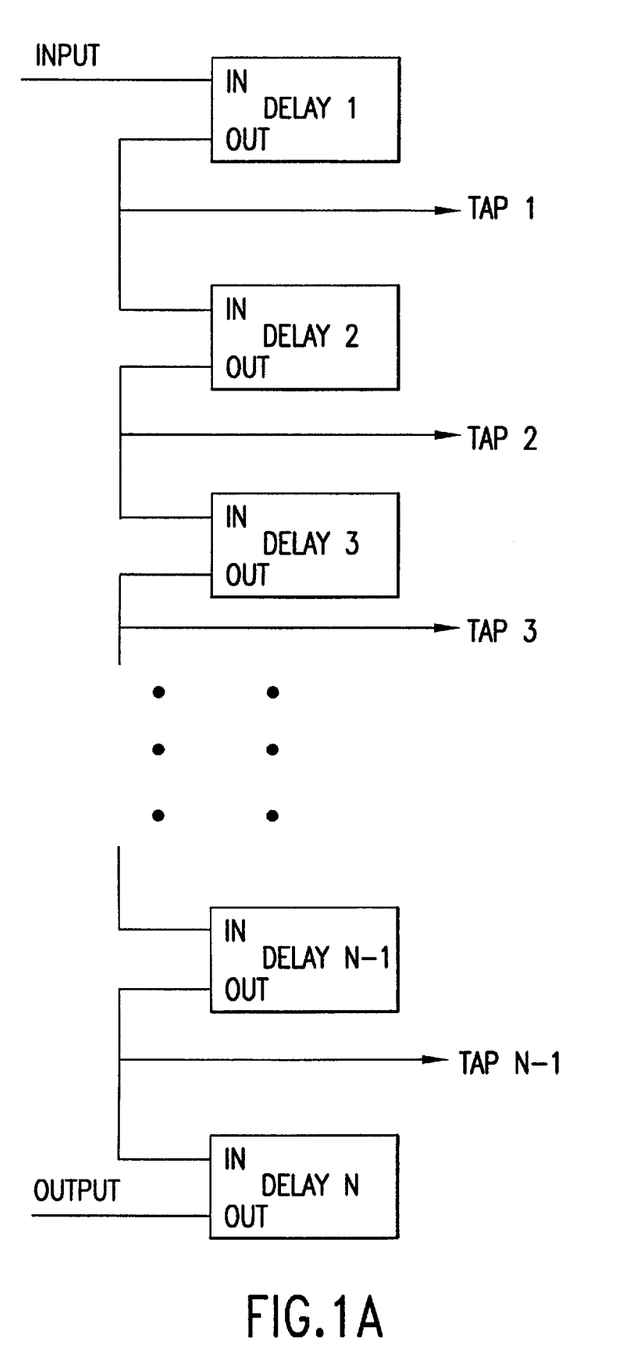
FIGS. 1A–B illustrate the delay chain of N taps to be evaluated.

Delay lines are used in many applications, ranging from delay-locked loops to pulse-width modulators. Delay lines generally consist of a set of smaller delay elements stacked one after another to form a longer delay line. The delay line can be tapped at various points, referred to henceforth as a "tap" preferably with equal distribution, as shown in FIG. 1A. An important attribute of a delay line is its linearity. Linearity is a measure of how closely the "delay vs. taps" curve approximates a straight line. A chain of N taps has a delay of $N*\psi$, where $\psi$ is the delay associated with each tap. Ideally, the chain is perfectly linear. In reality, the non-linearity must be evaluated. For standard compliance testing, a quantifiable measurement technique and acceptance criteria must be developed.

Figure 1B:
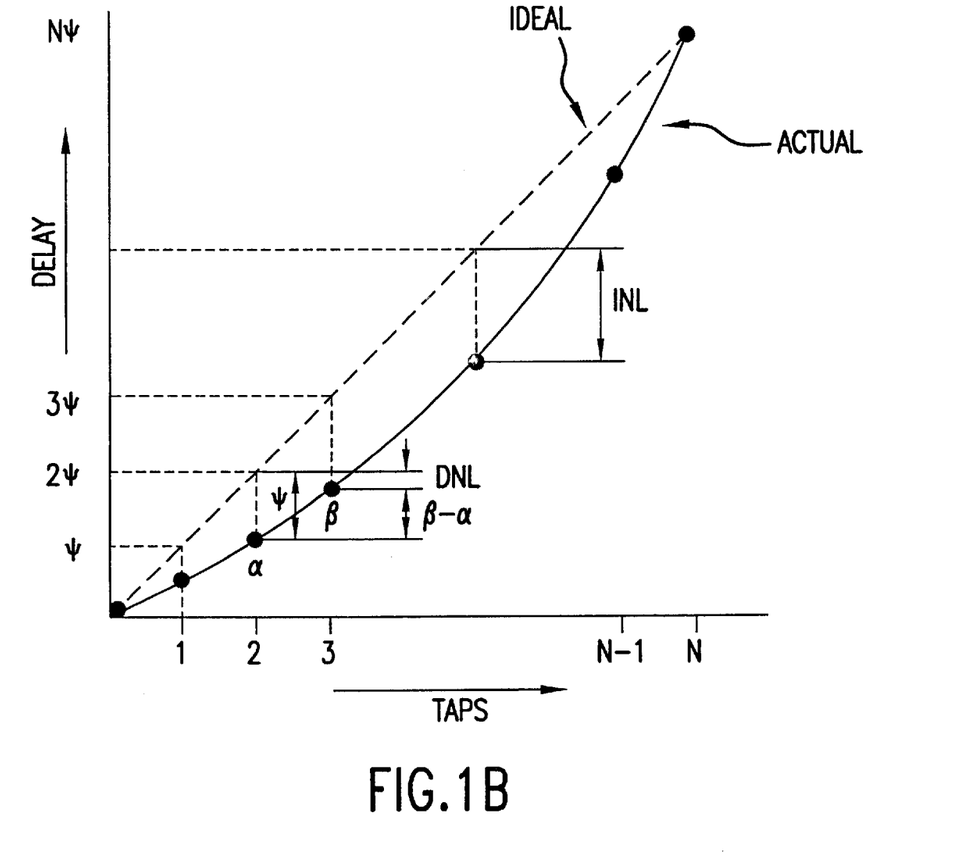

Two types of non-linearities, differential non-linearity (DNL) and integral non-linearity (INL), can occur in a delay chain. DNL is a comparison of the delay difference of two taps to the theoretical value. If one tap measures a while the next measures $\beta$, the DNL would be $|\psi-(\beta-\alpha)|$, where $\psi$ is the theoretical value of a single tap. The calculated DNL can then be compared to an acceptable tolerance. This process is then repeated while traversing the delay chain to ensure each tap is within tolerance. The INL measures how closely the delay vs. taps curve approximates a straight line, as shown in FIG. 1B. INL is a result of imperfect DNL. Some delay values may be smaller than the ideal, while other taps have larger than ideal delay values. This leads to the "bowing" of the line, shown in FIG. 1B. INL is a measure of how far off each point is from the theoretical line that connects the two endpoints. Again, this INL number can then be compared to a desired tolerance.

Currently, delay lines are evaluated using a tester to measure delay values or each tap of the delay chain. Afterwards, calculations are performed to determine the DNL and the ideal line for the INL. The measured values are then compared against the theoretical limits to determine if the part is within specification. This measurement technique requires programming the delay chain to the appropriate value and then stimulating the input with a clock edge. The tester then strobes the output. Since the tester needs to find the exact location of the clock edge, the tester needs to strobe for both a low and a high value (for rising clock edge). The test is a repetitive process as each test run requires changing the strobes to locate the transition edge. A standard binary search algorithm determines the number of iterations while the upper and lower bounds are determined by the clock period.

The prior art method is slow due to three main factors. First, the tester is used in a non-optimum manner. Digital testers are optimized for comparing ones and zeroes against an expected value not for making precision measurements. Second, the tester is slow in performing the computations since it does not perform them in real-time. Third, the method does not produce real-time failures, which are important in a production test environment. A real-time test failure flags at the time the failure occurs. This prior art method does not stop until the measurements, calculations, and comparisons against the specified limits are completed.

Additionally, smaller delay values are being measured. Delay values are rapidly approaching the minimum resolution of the tester itself. Such small values make most tests unfeasible except for gross monotonicity. Monotonicity testing alone is insufficient qualification as it only confirms that the derivative of the delay curve corresponds to the direction that the chain is being measured. There is insufficient data to fully characterize a delay chain.

SUMMARY

The present invention provides both differential and integral non-linearity measurement capabilities with a minimum of additional hardware and a test time reduction of several orders of magnitude. The test circuit for N delay lines includes a ring oscillator that has a select signal and an output. A counter is connected in parallel with the ring oscillator. An arithmetic logic unit receives a "COMPARE" value from a register and the counter output. An upper and a lower bound register store acceptable tolerances for non-linearity. Each comparator, upper and lower bound, receives the tolerance stored in the corresponding register and the output of the arithmetic logic unit. An AND gate receives the outputs of the upper and lower bound comparators and generates a signal indicative of the state of the oscillator.

There are three measurement techniques that may be applied to the test circuit. In the first measurement technique, the incremental paths in the delay chain are compared to test linearity of the entire delay chain independent of process, voltage, and temperature. In the second measurement technique, the delay paths are adjusted to a known value. In the third measurement technique, the ratio of two paths is compared with a known ratio of delay.

BRIEF DESCRIPTION OF THE DRAWINGS

FIG. 1A shows a schematic diagram of the delay chain. FIG. 1B shows the linearity of the delay vs. tap curve.

FIG. 2B illustrates an embodiment for the oscillator shown in FIG. 2A;

DETAILED DESCRIPTION OF THE DRAWINGS

Figure 2A:
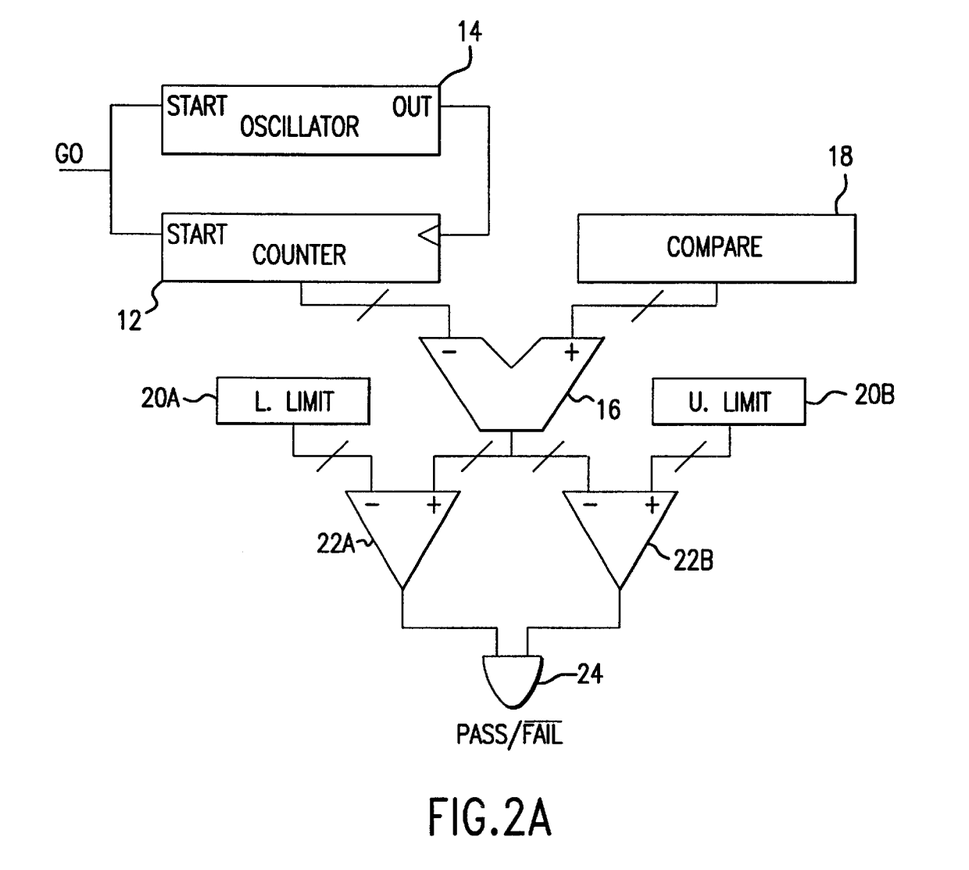
FIGS. 2A–B illustrate a test circuit of the present invention for the delay chain shown in FIG. 1A.

FIG. 2A illustrates a functional block diagram corresponding to the present invention 10. A start signal is input into a counter 12 and a ring oscillator 14. The ring oscillator 14 includes the delay chain (not shown) to be tested. The output of the ring oscillator 14 provides the clock input of the counter 12. An Arithmetic Logic Unit (ALU) 16 receives the output of the counter 12 and a COMPARE value from a storage register 18 as inputs. A first and a second comparator 22A, 22B compare the output of the ALU 16 with a first and a second limit registers 20A, 20B, respectively. The outputs of the first and second comparators 22A, 22B are inputs to an AND gate 24. The output of AND gate 24 indicates whether the testing has been successful.

During operation, the counter 12 counts the number of oscillations during a fixed period of time. The ALU 16 subtracts the COMPARE value from the output of the counter 12. The difference is then compared to a set of "limit" registers: one for the lower limit 20A and one for the upper limit 20B. The results are logically ANDed to determine whether the part passes or fails the test. FIG. 2A can test for both differential non-linearity (DNL) and integral non-linearity (INL) for the individual elements in each tap. These vertical strips of delay are tested by programming each tap to go through the exact same number of delay elements.

The vertical strips of delay are the array of atomic delay cells that make up the adjustable delay block (or tap delay block). The number of atomic delay cells that the delay path is routed through depends upon the delay_ctl value. Since the various paths (selected by the delay_ctl input) should have a linear progression of delay, the linearity of this structure can be tested. Similarly, the horizontal taps should have a linear progression of delay that can be tested.

The INL is tested since the linear response of the delay chain is predicted from the first value that is measured (as the delay relationship of each tap or path is known). If the INL does not meet specification, e.g. varies significantly from a straight line, the prediction will fail before all inputs are tested. Likewise, if an individual DNL fails, the test fails at that particular path or tap.

Figure 2B:
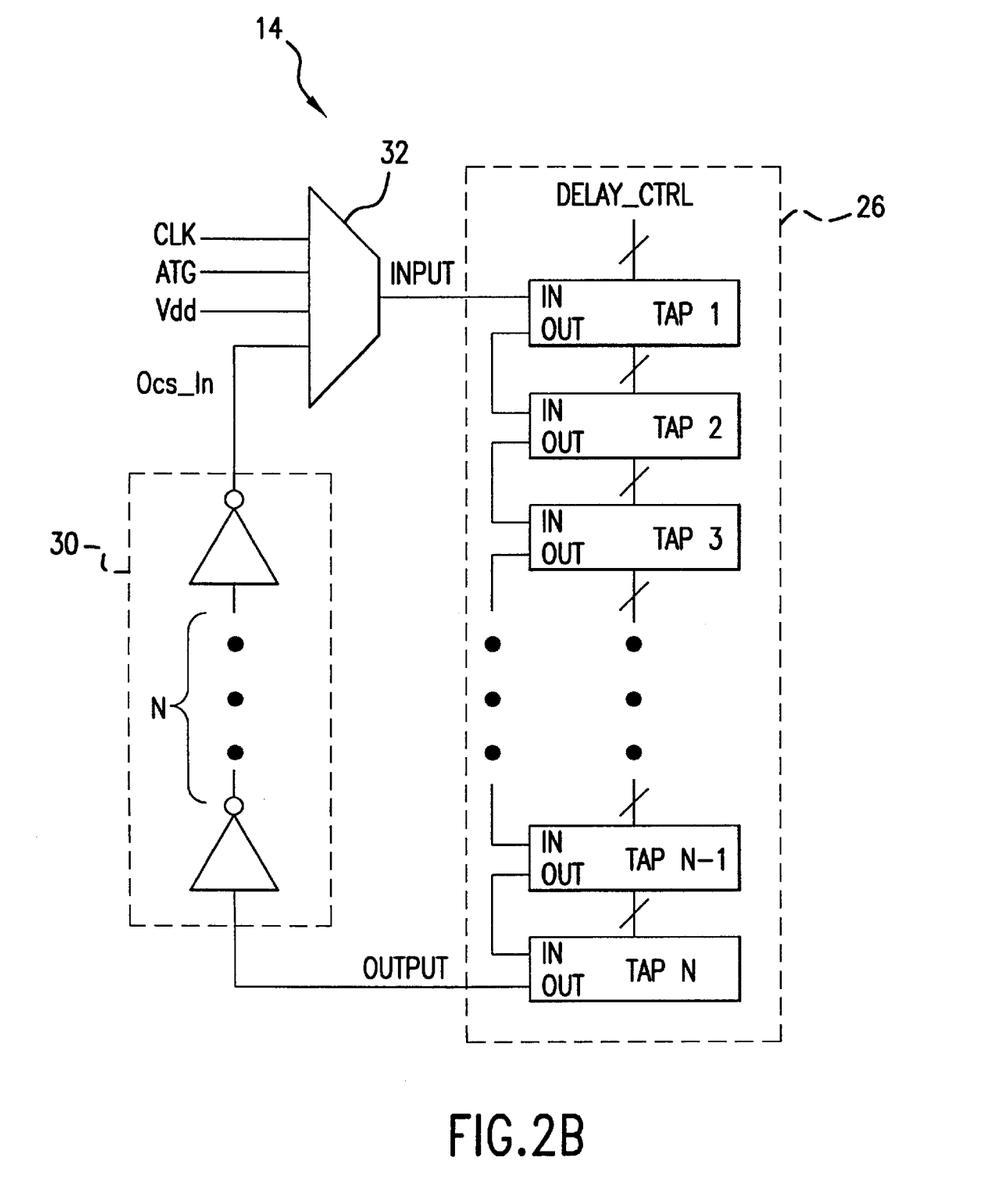

FIG. 2B illustrates the ring oscillator 14 shown in FIG. 2A. The ring oscillator consists of a delay chain 26, e.g. a plurality of taps connected in series. The output of the delay chain is received by a series of an odd number of inverters 30. The number of inverters depends upon physical distance between the input and output of the delay chain. In addition, the inverters are preferably equally distributed to keep the overall delay component dependent instead of wire-length dependent. This helps to keep clock transitions sharp that can degrade when driven by a long, capacitive wire. The series of inverters 30 is fed into a multiplexer (MUX) 32 that operates as a gating device.

For continuous oscillation, two criteria must be met. The first is that the feedback loop must contain an odd number of inversions to force the delay chain to change states. The second is that the loop must possess sufficient gain to sustain an oscillation. Each tap has sufficient delay such that it can reach its full voltage swing. Otherwise, a condition ensues in which the output hovers around an intermediate voltage with no switching, similar to feeding the output of a simple inverter back to its own input.

The MUX 32 performs several functions for different modes of operations, as shown in FIG. 2B. During normal operation, the MUX 32 routes the system clock into the delay chain. When performing stuck-at-fault testing as part of the Automatic Test Generation (ATG) mode, the MUX 32 provides a static signal to feed the delay chain. The last two inputs $V_{dd}$ and $O_{SC}$ provide stimuli for the present invention. Prior to starting the ring oscillator 14, the delay chain 26 is initialized. Transitions within the delay chain 26 are cleared with a logical HIGH signal that is allowed to propagate to the output before the oscillator is formed. A logical HIGH is fed into the chain for an accurate count of the number of oscillations. If a logical LOW signal had been applied instead, the counter would register the first count after only one-half of the clock cycle. After clearing, the MUX feeds the delay chain output back into its input, closing the loop thereby causing the circuit to oscillate.

The output of the oscillator 14 provides the clock signal for a synchronous counter. The counter tracks the number of clock cycles that have occurred in a predetermined time, e.g. exposure time. As shown in FIG. 2A, the start pins of the counter and the oscillator are tied together. This allows for simultaneous starting and stopping of the exposure time for both circuits to provide an accurate count. The result of the first count is then stored in a register for later use. The output of the counter is fed into the ALU.

The "Compare" register 18 may contain several different values. The value depends on the method used during the exposure time. To accurately measure the linearity of the delay line, the measurement circuit needs fine resolution with sufficient sensitivity to distinguish the difference between two measurements that are separated by the minimum tap delay. Due to the nature of the delay tap design, multiple measurements must be made. Each delay tap consists of smaller delay elements. Ramakrishnan described these elements in U.S. Pat. No. 5,900,762, assigned to Agilent Technologies. Since each tap consists of multiple delay elements, the linearity test comprises running the previously outlined flow multiple times. Each time the test is run, the value of the delay taps is changed via the "delay_ctrl" bus 16 shown in FIG. 2B. This then tests the linearity of each tap as well as the full chain.

There are three measurement techniques that may be applied to the test circuit. In the first measurement technique, the incremental paths in the delay chain are compared to test linearity of the entire delay chain independent of process, voltage, and temperature. In the second measurement technique, the delay paths are adjusted to a known value. In the third measurement technique, the ratio of two paths are compared with a known ratio of delay.

In an embodiment of the first measurement technique, the counter is run until a distinguishing count is determined. This is the minimum wait time, e.g. the time needed to distinguish the last tap from the penultimate tap, which can be calculated with the following: $T_{min}=(t_{DCmax}/t_{TAPmin})*t_{Dcmax}$. $t_{DCmax}$ is the maximum value of the entire delay chain and $t_{TAPmin}$ is the minimum value of a single tap. Using this method for exposure time, for each measurement, the value of the counter will change. This implies that the value in the "Compare" register will change. The initial measurement is shifted and scaled to the expected value. By using the initial measurement, the effects of the process, voltage, and temperature are taken into account.

In an alternate embodiment of the first measurement technique, another embodiment for Method 1, the exposure time is scaled to achieve the same count for each tap. This simplifies the "Compare" register that now only needs the value of the first measurement and decreases the test time. The theory behind this is that the minimum exposure time, $T_{min}$, can be decreased toward the "top" of the delay chain, where the total delay value is less since the effective $t_{DCmax}$ is smaller. By decreasing the counter's exposure time proportional to the expected delay, the same count (with some tolerance) is achieved for each measurement. The time savings is the square of the difference of the total effective delay value $(t_{DCmaxOLD}-t_{DCmaxNEW})^2/t_{TAPmin}$. Decreasing $t_{Dcmax}$ by a third yields a factor of 9 in test time savings per measurement. This method also uses a measured value for its baseline comparison, so the effects of process, voltage, and temperature are fully compensated.

Figure 3A:
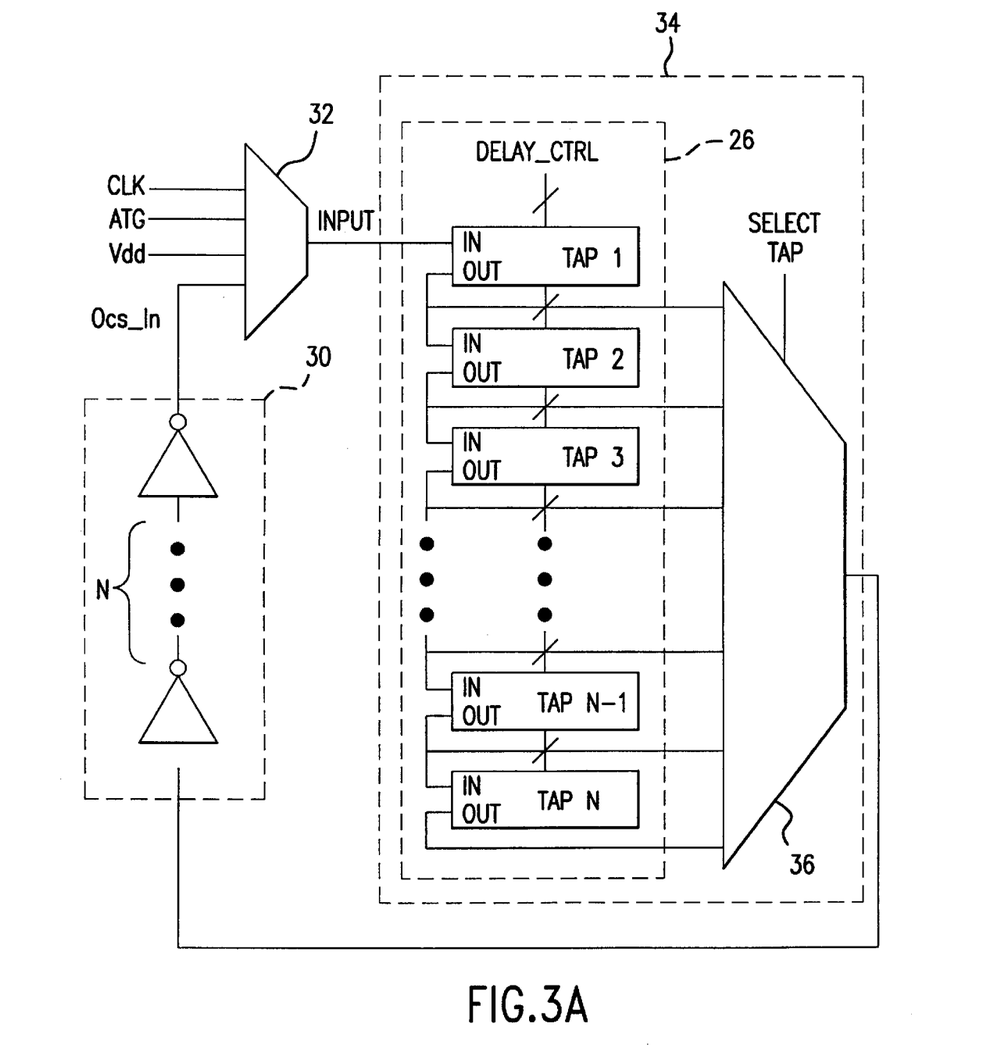
FIGS. 3A–B illustrate alternate embodiments for the oscillator shown in FIG. 2A.

In an embodiment of the second measurement technique, which uses the oscillator 34 shown in FIG. 3A, the delay paths must be calibrated, e.g. delay adjusted automatically to a known delay value. The outputs from each tap in delay chain 26 are inputs to a second MUX 36. The second MUX 36 allows for selective testing of the tap delays.

Figure 3B:
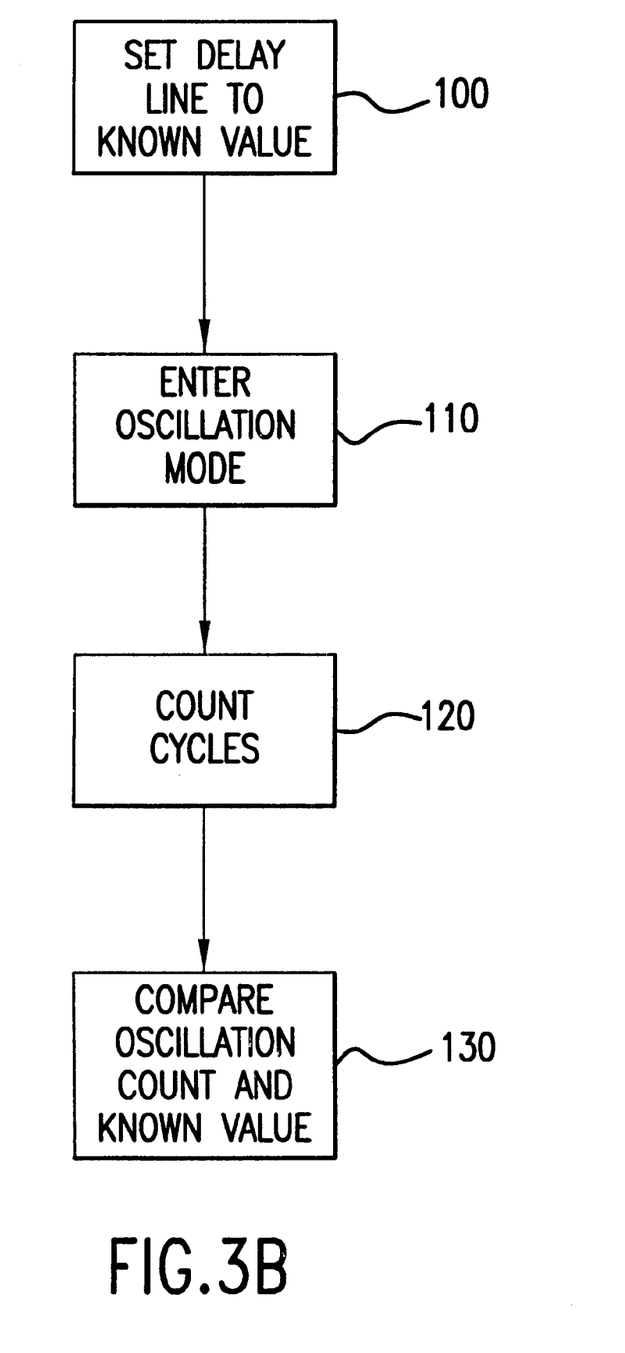

FIG. 3B illustrates a test process flowchart using the oscillator 34 shown in FIG. 3A. In step 100, the delay line is initialized by being locked to a known value. In step 110, the delay line is then put into oscillation mode. In step 120, the number of clock cycles in the exposure period are counted and stored. For each delay line, in step 130, the measured number of clock cycles is compared to the stored number of clock cycles.

To illustrate, if the delay-lock loop targets a 20 ns total delay (from the input of tap 1 to the output of tap N), the delay line can be put into oscillation with this delay control setting. Since each pass through the delay line takes 20 ns, a full oscillation (two passes through the delay line) will take 40 ns. Thus, if the oscillation is allowed to continue for 4000 ns, the oscillation counter will be 100. As the oscillation feedback path (the odd number of inverters) adds some delay to the path, the count may be adjusted to accommodate for this additional delay. Since there may be an error in the total delay of the line, a tolerance of a few percent is incorporated in the limits to allow for a reasonable amount of error. This will not affect the device performance. In this embodiment, each tap is tested for both DNL and INL. DNL and INL are both tested using a theoretical scaling of the first delay measurement to compare against future measurements. If consecutive measurements fall into the theoretically calculated windows, the element conforms to both the DNL and INL specifications.

Figure 4:
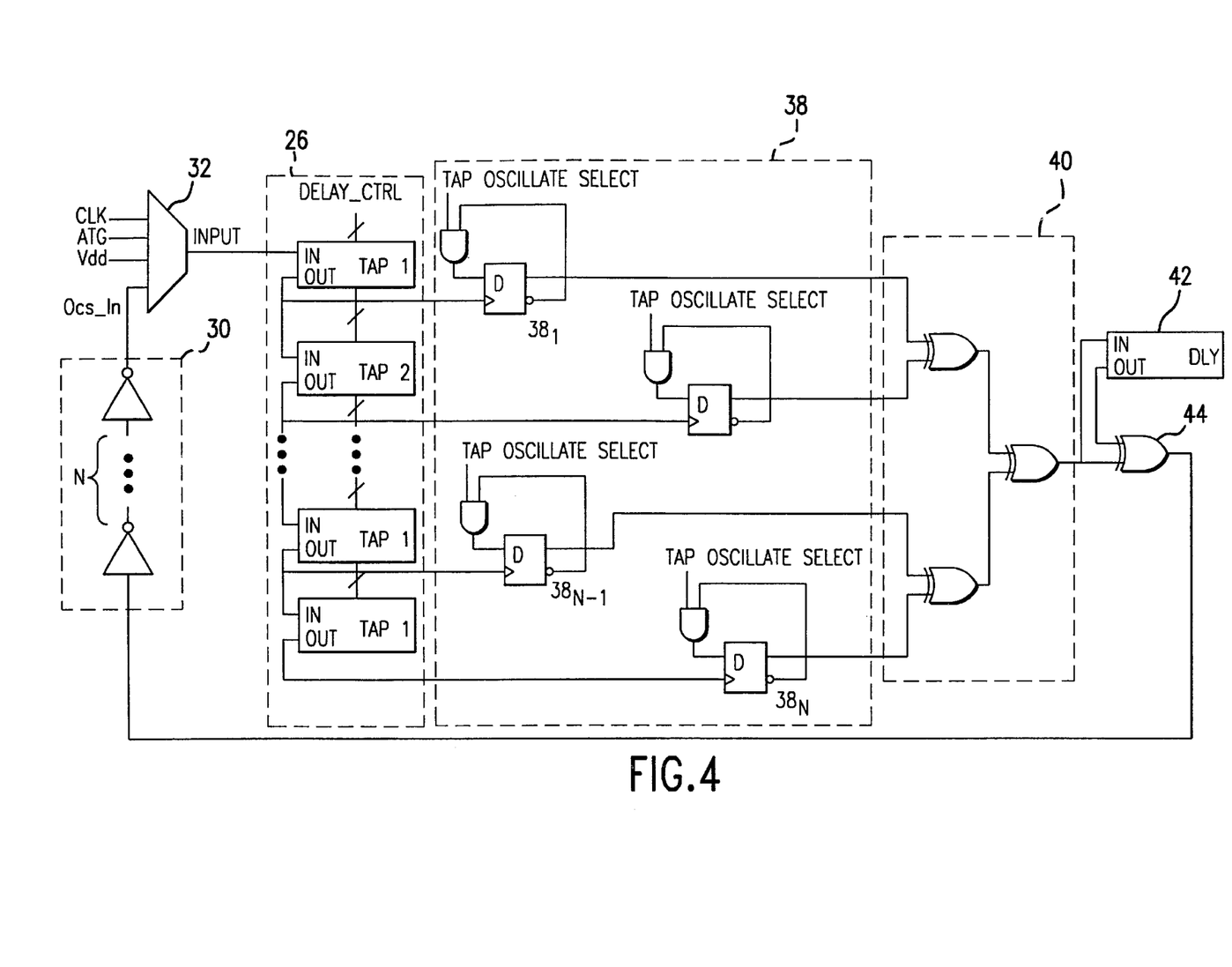
FIG. 4 shows a pulse width modulator.

In an embodiment of the third measurement technique, which uses the oscillator 34 shown in FIG. 4, two paths are compared with a known ratio of delay. In this embodiment, tap oscillate selectors $38_x$ replace the second MUX 36 lo shown in FIG. 3A. The outputs from each tap in delay chain 26 are connected to individual tap oscillate selectors $38_x$. The outputs of the individual tap oscillate selectors $38_x$ are combined with an XOR tree 40. The output of XOR tree 40 is combined with a known delay 42 by XOR 44. The output of XOR 44 is input into inverter series 30.

The target pulse width modulator has such a delay-lock loop capability. Multiple paths with a known ratio of delay are tested. If a delay line with set delay values for each tap is tested, the actual delay of each tap varies with changes in process, voltage, and temperature. It may not be possible to estimate the delay value. However, there is a known ratio of delays on each tap output. Each tap involves an incremental number of delay cells. Therefore, tap 2 has twice the delay as tap 1. Likewise, tap 30 has thirty times the delay of tap 1. If the oscillation loop is forced to go through any of the output taps, the oscillation counts of each tap oscillation can be compared. To compare similar numbers, the time of the oscillations is increased in proportion to the tap through which the oscillation is occurring. This test provides for the verification of the linearity of each tap output.

To avoid estimating the delay of any path, the first tap would be measured then stored in the compare register. The limit registers would be negative and positive fractions of the compare value (the fraction determined as a small percentage). A multiplexer to select from any of the tap output and route to the oscillator input would be required to allow for tap testing. This type of multiplexer is found in conventional delay-line designs, therefore minimal additional hardware would be required.

For a pulse width modulator shown in FIG. 4, the taps are used to clock the tap oscillate selectors $38_x$, the outputs are combined with an XOR tree 40. The tap_oscillate_select signal, when enabled, selects which tap will enter the XOR tree 40. To maintain the normal data path, the tap oscillate selector $38_x$ requires the transition output to be frequency doubled to allow oscillation to occur through the flip-flop. The clock doubling is accomplished by taking the selected tap output and XOR it with a delay version of itself. To control the delay amount, a controllable delay element (similar to the one used for each tap delay cell) can be used. In addition, the tap oscillate selectors $38_x$ are forced to toggle in sequence for oscillation to occur. The tap oscillate selector $38_x$ having an enabled toggle signal, e.g. tap_ oscillate_signal, is the tap that will be in the oscillation path. Delay chain 26, the flip-flops of the tap oscillate selectors $38_x$, and the XOR tree 40 are leveraged from a pulse width modulator.

In an alternate embodiment for the third measurement technique, the related paths are compared using adjustable delay cells. To achieve delay-lock loop capability, the delay cells need to have a programmable number of delays within. The delay of the cell increases proportionally to the control count input into it. If the control count can be independently controlled, then the entire delay chain can be measured multiple times, each time the control count (delay_ctl) input to the cells is increased to the next value. Likewise, the oscillation is allowed to continue for a time that is proportional to the delay_ctl input. The results of all iterations should be within a reasonable tolerance of each other. The tolerance is then loaded into the compare limit registers.

The hardware may be used to calibrate the delay chain and load a fixed value for comparison. This is straightforward as the value is based on the clock frequency input into the delay chain. While this does not test linearity, it does provide a test of the closed loop system that is not achievable by other tests. It will detect failures in the control logic and the "natural" feedback loop. While an illustrative example using adjustable delay elements has been described, this concept is extendable to fixed value delay elements, whether analog or digital.

We claim:

1. A test method for N delay lines comprising the steps of:
   initializing the N delay lines that are connected within an oscillator;
   oscillating the N delay lines;
   counting the number of clock cycles in the exposure period;
   storing the number of clock cycles;
   for each delay line, measuring the number of clock cycles corresponding to the delay line; and
   for each delay line, comparing the measured number of clock cycles to the stored number of clock cycles.

2. A test method for N delay lines, as defined in claim 1, wherein the step of comparing the measured number of clock cycles to the stored number of clock cycles further comprising the step of adjusting each measurement to a known value.

3. A test method for N delay lines, as defined in claim 1, wherein the step of comparing the number measured number of clock cycles to the stored number of clock cycles comprises the step of comparing the ratio of two of the delay lines to a known delay ratio.

4. A test method for N delay lines, as defined in claim 1, wherein the step of comparing the measured number of clock cycles to the stored number of clock cycles is independent of process, voltage, and temperature effects.

5. A test method for N delay lines, as defined in claim 4, the step of comparing the measured number of clock cycles to the stored number of clock cycles further comprising the steps of shifting and scaling each measurement to correspond to the exposure period.

6. A test method for N delay lines, as defined in claim 5, wherein the step of comparing the measured number of clock cycles to the stored number of clock cycles comprising the steps of shifting and scaling the exposure period to correspond to each measurement.

7. A test circuit for N delay lines comprising:

an oscillator including the N delay lines, having a select signal and an output;

a counter, receiving the select signal, having an output connected to the oscillator output;

a register having a COMPARE value;

an arithmetic logic unit, receiving the COMPARE value and the counter output, having an output;

an upper and a lower bound register;

an upper and a lower bound comparator, each having an output, each connected to a corresponding register and the output of the arithmetic logic unit; and an AND gate, receiving the outputs of the upper and lower bound comparators, generating a signal indicative of the state of the oscillator.

8. A test circuit, as defined in claim 7, the oscillator further comprising:

a multiplexor, receiving the select signal, having an input and an output;

the N delay lines connected in series, having an output, receiving the multiplexor output; and a plurality of serially connected inverters, where the plurality is an odd number, connected between the output of the delay lines and the multiplexor input.

9. A test circuit, as defined in claim 8, wherein the plurality of serially connected inverters are evenly distributed to minimize the effect of wiring delays.

10. A test circuit, as defined in claim 7, the oscillator further comprising:

a first multiplexor, receiving the select signal, having an input and an output;

the N delay lines, connected in series, each delay line having an output;

a second multiplexor, receiving the select signal, receiving the output of the N delay lines, having an output; and a plurality of serially connected inverters, receiving the second multiplexor output, connected to the first multiplexor input.

11. A test circuit, as defined in claim 10, wherein the plurality of serially connected inverters are evenly distributed to minimize the effect of wiring delays.

12. A test circuit, as defined in claim 7, the oscillator further comprising:

a first multiplexor, receiving the select signal, having an input and an output;

the N delay lines, connected in series, each delay line having an output;

programmable delay cells, receiving the select signal, receiving the output of the N delay lines, having an output; and a plurality of serially connected inverters, receiving the output of the programmable delay cells, connected to the first multiplexor input.

13. A test circuit, as defined in claim 12, wherein the plurality of serially connected inverters are evenly distributed to minimize the effect of wiring delays.

* * * * *